United States Patent
Darthenay

(10) Patent No.: US 6,741,281 B1
(45) Date of Patent: May 25, 2004

(54) LOW-NOISE MEMORY DEVICE HAVING A HIGH SAMPLING FREQUENCY

(75) Inventor: Frédéric Darthenay, Saint Aubin sur Mer (FR)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/571,454

(22) Filed: May 16, 2000

(30) Foreign Application Priority Data

May 18, 1999 (FR) .............................. 99 06299

(51) Int. Cl.[7] .............................. H04N 5/217
(52) U.S. Cl. ...................................... 348/241
(58) Field of Search .................. 348/303, 241, 348/313; 396/125; 711/105

(56) References Cited

U.S. PATENT DOCUMENTS 4,987,321 A * 1/1991 Toohey ........................ 327/96
6,018,364 A * 1/2000 Mangelsdorf ............... 348/241

* cited by examiner

Primary Examiner—Wendy R. Garber
Assistant Examiner—Nelson D. Hernández
(74) Attorney, Agent, or Firm—Michael J. Ure

(57) ABSTRACT

The present invention relates to a memory device including a capacitive element C1, a terminal of which is connected via a switch SW1 to an input intended to receive an input signal Vccd.

According to the invention, the switch SW1 comprises a first and a second bipolar transistor T1 and T2 whose main current paths are arranged head to end between the input and capacitive element C1, and is also provided with control means for alternately extracting or injecting current from or into the bases of the first and second transistors T1 and T2.

The invention allows memorization of the value of the input signal Vccd at a high sampling frequency and a low noise level as compared with that of known memory devices.

7 Claims, 2 Drawing Sheets

LOW-NOISE MEMORY DEVICE HAVING A HIGH SAMPLING FREQUENCY

BACKGROUND OF INVENTION

The present invention relates to a memory device having input and output terminals intended to receive and supply input and output signals, respectively, said device including a capacitive element, a terminal of which constitutes the output terminal of the device and is connected to the input terminal via a switch.

Such devices are currently used in video cameras for generating video signals before signal-processing units, on the basis of signals supplied by light sensors, for example, sensors of the CCD type. Such a sensor supplies a pseudo-periodical signal successively presenting, in the course of the same pseudo-period, a reference level and a video level. It is the difference between these two levels, which constitutes the video signal to be used by the signal-processing unit. A device for generating a video signal thus usually comprises a first and a second memory device intended to memorize the reference and video levels, respectively, in each pseudo-period, and a subtracter intended to implement a difference between said levels.

Such a generating device is described in U.S. Pat. No. 4,987,321. Transistors of the NMOS type constitute the switches used in the memory devices included in the known generating device. The transistors of this type have relatively low switching velocities, of the order of about ten nanoseconds, which implies that the memorization's can only be correctly carried out for input signals whose frequency does not exceed about 100 MHz. Moreover, when an NMOS transistor is turned on, it has a resistance, referred to as pass-on resistance, whose value is not negligible. By way of example, an NMOS transistor having dimensions which are referred to as standard hereinafter, i.e. having a gate width of 0.5 microns and a gate length of 100 microns, powered under 3 V, will have a pass-on resistance of the order of about 100 Ohms. Such a pass-on resistance generates noise in the memorized signal and thus in the video signal which may be detrimental to a satisfactory exploitation of this signal. This noise may be compensated by choosing NMOS transistors of large dimensions for realizing the switches, but such an embodiment is costly in terms of silicon surface and energy consumption of the generating device.

SUMMARY OF THE INVENTION

It is an object of the present invention to remedy these drawbacks to a large extent by proposing a memory device which can operate at relatively high frequencies and generates less noise than the known devices without necessitating a large silicon surface for its realization.

To this end, a memory device as described in the opening paragraph is, according to the invention, characterized in that the switch comprises a first and a second bipolar transistor whose main current paths are arranged head to end between the input and output terminals, the switch also being provided with control means for alternately extracting or injecting the current from or into the bases of the first and second transistors.

The bipolar transistors have switching times which are intrinsically smaller than those of the MOS type transistors and may thus operate at higher frequencies. These switching times are even more reduced because the transistors are current-controlled. The use of two transistors whose current paths are arranged head to end also ensures an optimum current conduction to or from the capacitive element. At similar dimensions, a bipolar transistor has a pass-on resistance which is intrinsically smaller than that of a transistor of the NMOS type and is independent of the energy consumption of said bipolar transistor.

In a particular embodiment of the invention, a memory device as described above is characterized in that the control means include a first and a second controllable current source arranged between the bases of first and second transistors and first and second power supply terminals, respectively, the bases of the first and second transistors being short circuited.

In this embodiment, the first current source controls the conduction of the first and second transistors, while the second current source controls the interruption of said conduction. This interruption is very quick because the second current source directly extracts charges from the bases of the first and second transistors. The first and second current sources are controlled by signals which are generated outside the memory device on the basis of the input signal in accordance with a technique known to those skilled in the art.

In a preferred embodiment of the invention, the memory device comprises means for preventing simultaneous conduction of the first and second current source s.

This embodiment eliminates any possibility of the control signals of the first and second current sources being active at the same time and renders the switch immune to any short-circuit between the two current sources.

In a variant of the invention, the memory device comprises a voltage-regulating element arranged between the output terminal and the bases of the first and second transistors, enabling the amplitude of the base-emitter voltages of the first and second transistors to be limited.

The voltage-regulating element which may be, for example, of the follower type, ensures that the value of the potential of the bases of the first and second transistors is of the same order as that of the DC components of the input and output signals. The amplitude of the base-emitter voltages of the first and second transistors thus remains low, which limits the wear of these transistors and contributes to a longer lifetime of the memory device. Moreover, this regulating element prevents that too strong base-emitter voltages trigger the conduction of the bipolar transistors when the first current source is not conducting.

If the present invention may be used in any type of application involving the memorization of an analog signal, its implementation is particularly advantageous within the scope of processing signals coming from light sensors. The invention thus also relates to a device for generating a video signal, provided with an input intended to receive a pseudo-periodical input signal successively presenting, in the course of each pseudo-period, a reference level and a video level, and an output intended to supply an output signal which is representative of a difference between said levels, said device comprising:

a first and a second memory device intended to memorize the reference and video levels, respectively, in each pseudo-period, and a subtracter intended to implement a difference between said levels, said device being characterized in that the first and second memory devices are devices as described hereinbefore.

In one of its most advantageous implementations, the invention also relates to an image acquisition device, for example, a video camera or a digital photo camera, comprising:

a device for detecting and converting light into a pseudo-periodical electronic signal, an input stage intended to receive said electronic signal and to supply a video signal, and a signal for processing unit intended to exploit said video signal, said acquisition device being characterized in that the input stage includes a generating device as described hereinbefore.

These and other aspects of the invention are apparent from and will be elucidated, by way of non-limitative example, with reference to the embodiment(s) described hereinafter.

DESCRIPTION OF THE PREFERRED EMBODIMENTS

Figure 1:
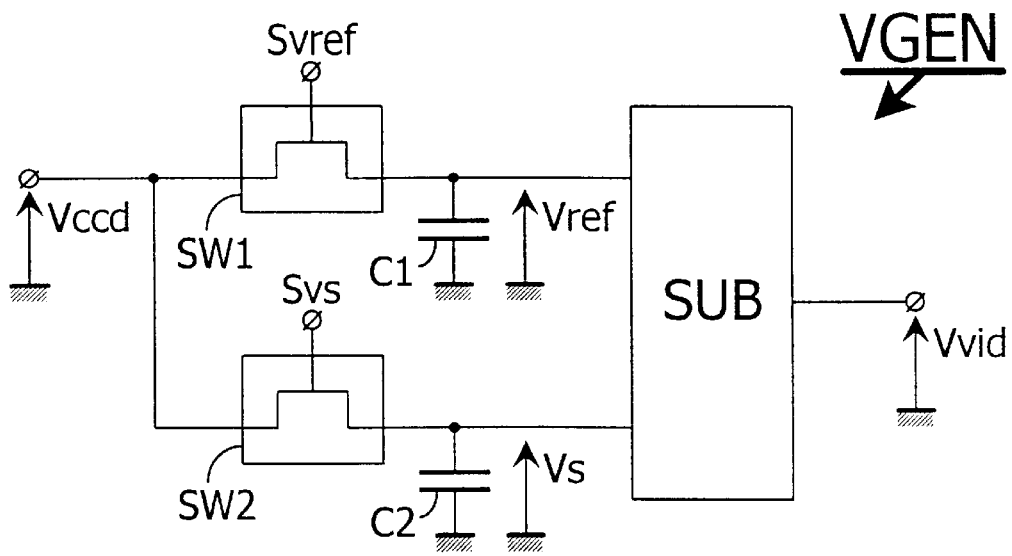
FIG. 1 is a functional diagram of a device for generating a video signal.

FIG. 1 shows diagrammatically a device VGEN for generating a video signal Vvid, provided with an input intended to receive a pseudo-periodical input signal Vccd presenting successively, in the course of each pseudo-period, a reference level and a video level, and an output intended to supply an output signal Vvid which is representative of a difference between said levels. This generating device VGEN comprises:

a first memory device (SW1, C1) intended to receive the input signal Vccd and to memorize the reference level in each pseudo-period, a second memory device (SW2, C2) intended to receive the input signal Vccd and to memorize the video level in each pseudo-period, and a subtracter SUB intended to implement a difference between said levels and to supply the output signal Vvid.

Each memory device comprises a capacitive element (C1, C2), a terminal of which constitutes the output terminal of the device and is connected to the input terminal via a switch (SW1, SW2) which is controlled by a signal (Svref, Svs) which is active and controls the conduction of said switch SW1 or SW2 when the level of the input signal Vccd is that which the capacitive element to which the switch is connected must memorize, and inactive in the other case. Each capacitive element (C1, C2) has a voltage (Vref, Vs) at its terminals, which voltage is constant and representative of the memorized level when the control signal (Svref, Svs) is inactive.

Figure 2:
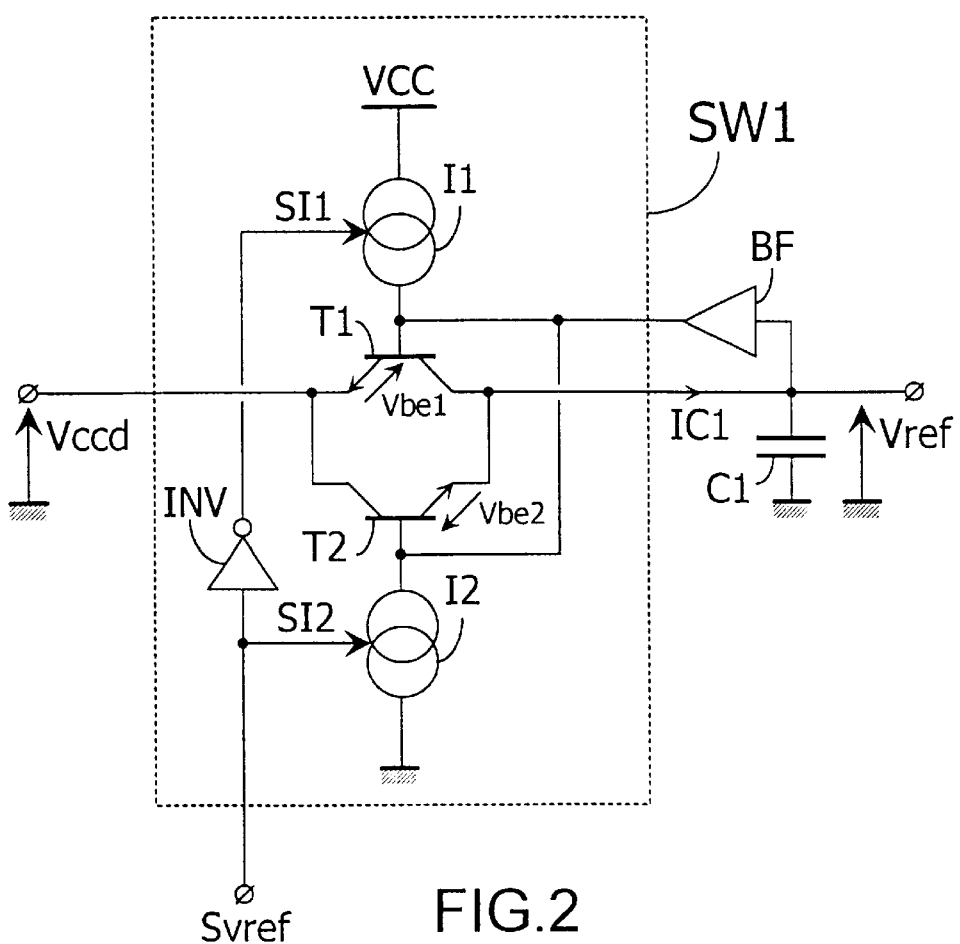
FIG. 2 is an electric circuit diagram of a memory device according to the invention.

FIG. 2 is an electric circuit diagram of a memory device (SW1, C1) according to the invention. In this device, the switch SW1 comprises a first and a second bipolar transistor (T1, T2) whose main current paths, constituted by their collector-emitter junctions, are arranged head to end between the input and output terminals of the memory device, the switch SW1 also being provided with control means for alternatively extracting or injecting current from or into the bases of the first and second transistors (T1, T2).

In this example, these control means include a first and a second controllable current source (I1, I2) arranged between the bases of the first and second transistors and a power supply terminal VCC and ground of the device, respectively, the bases of the first and second transistors (T1, T2) being short-circuited.

This device operates as follows.

The conduction of the first and second current sources (I1, I2) is controlled by first and second control signals (SI1, SI2). When, in a follower phase, the first control signal SI1 is active, for example at the logic level 1, while the second control signal SI2 is inactive, i.e. at the logic level 0 in this example, the first current source I1 conducts and injects a current into the bases of the first and second transistors (T1, T2) which thus become potentially conducting. If the voltage Vccd is larger than the voltage Vref at the terminals of the capacitive element C1, said element C1 is charged by means of a positive current IC1. It is then the second transistor T2 that is turned on. If, conversely, the voltage Vccd is smaller than the voltage Vref at the terminals of the capacitive element C1, said element C1 is discharged by means of a negative current IC1. It is then the first transistor T1 that is turned on. Thus, when the first current source I1 is conducting, the input voltage Vccd is recopied at the terminals of the capacitive element C1.

When the first current source I1 is conducting, a pass-on resistance, denoted Ron, appears between the input and output terminals of the memory device. This pass-on resistance may be expressed in the form of $Ron = Vce_{sat}/IC1$, where $Vce_{sat}$ is the saturation voltage of that one of the first or second transistor, T1 or T2, which is turned on, i.e. $Ron = 5 \cdot Vt/(\beta \cdot I1)$, $\beta$ being the gain of one of the first or second transistor T1 or T2, Vt being equal to k.T/q where k is the Boltzmann constant, T is the absolute temperature and q is the electron charge. At 25° C., Vt=26 mV and with a gain $\beta$=50 for a bipolar transistor having dimensions which are equivalent to the above-defined standard dimensions and I1=300 μA, Ron is less than about 10 Ohms, i.e. more than ten times smaller than the pass-on resistance of a transistor of the NMOS type of similar dimensions. The memory device according to the invention thus generates a much lower noise than that generated by the known devices.

When, in a sustain phase, the second control signal SI2 is active, while the first control signal SI1 is inactive, the second current source I2 conducts and extracts a current from the bases of the first and second transistors (T1, T2) whose conduction is thus interrupted quasi-instantaneously. The voltage Vref, which is present at the terminals of the capacitive element C1 and represents the voltage Vccd at the input terminal during the preceding follower phase, is thus memorized until the next follower phase.

The first and second control signals SI1 and SI2 may be elaborated independently from each other outside the memory device (SW1, C1) in accordance with techniques which are well known to those skilled in the art. Nevertheless, in the example described here, the memory device comprises means for preventing simultaneous conduction of the first and second current sources (I1, I2). In this embodiment, these means consist of a logic inverter INV intended to receive a unique control signal Svref at the input, which signal corresponds in this case to the second control signal SI2, and whose output is intended to supply the first control signal SI1. The first and second control signals (SI1, SI2) are thus permanently in phase opposition and, consequently, cannot be active at the same time, which renders the switch SW1 immune to any short-circuit between the two current sources (I1, I2). In other embodiments, the inverter INV may be replaced by delay cells introducing a phase shift of 180° between the first and second control signals (SI1, SI2).

Moreover, the memory device comprises a voltage-regulating element BF arranged between the output terminal and the bases of the first and second transistors (T1, T2) with which the amplitude of the base-emitter voltages (Vbe1, Vbe2) of the first and second transistors (T1, T2) can be limited.

The voltage-regulating element BF, which may be, for example, of the follower type, ensures that the value of the potential at the bases of the first and second transistors (T1, T2) is of the same order as that of the DC components of the input and output signals (Vccd, Vref). The amplitude of the base-emitter voltages (Vbe1, Vbe2) of the first and second transistors (T1, T2) will thus remain low, which limits the wear of said transistors and contributes to a longer lifetime of the memory device. Moreover, this regulating element BF prevents too strong base-emitter voltages (Vbe1, Vbe2) from inadvertently triggering the conduction of the first and second transistors (T1, T2) when the first current source I1 is not conducting.

Finally, it will be advantageous to provide the first and second transistors T1 and T2 with a ring collector structure. Such a structure prevents large charge quantities from propagating in the substrate of the integrated circuit on which the memory device is built, when the switching actions of the transistors are controlled by strong current pulses. Such propagation phenomena would cause conduction of parasitic junctions existing within the integrated circuit, which conduction could be risky and lead to destruction of this circuit.

Figure 3:
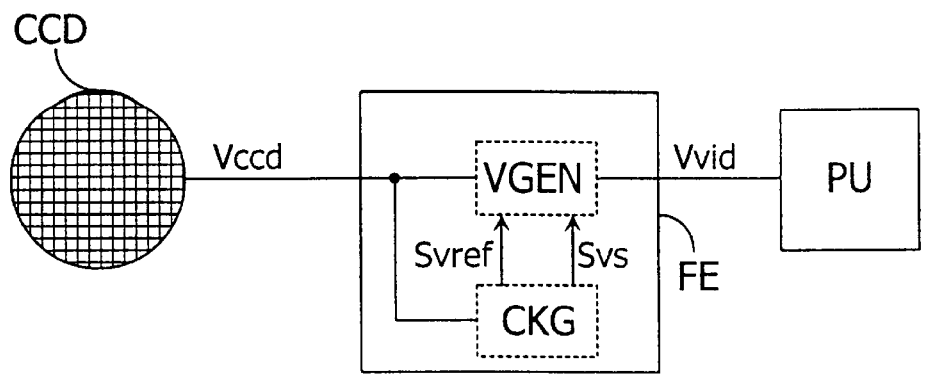
FIG. 3 is a partial functional diagram of a camera in which the invention is used.

FIG. 3 shows very diagrammatically a video camera in which the invention is used. This camera comprises:
- a device CCD for detecting and converting light into a pseudo-periodical electronic signal Vccd,
- an input stage FE intended to receive said electronic signal Vccd and to supply a video signal Vvid, and
- a signal-processing unit PU intended to exploit said video signal Vvid, which unit advantageously comprises an A/D converter for digital processing of the video signal Vvid.

In this camera, the input stage FE includes a generating device VGEN as described hereinbefore, intended to receive the control signals (Svref, Svs) from a clock generator CKG. These signals are elaborated on the basis of the input signal Vccd of the generating device VGEN.

Figure 4:
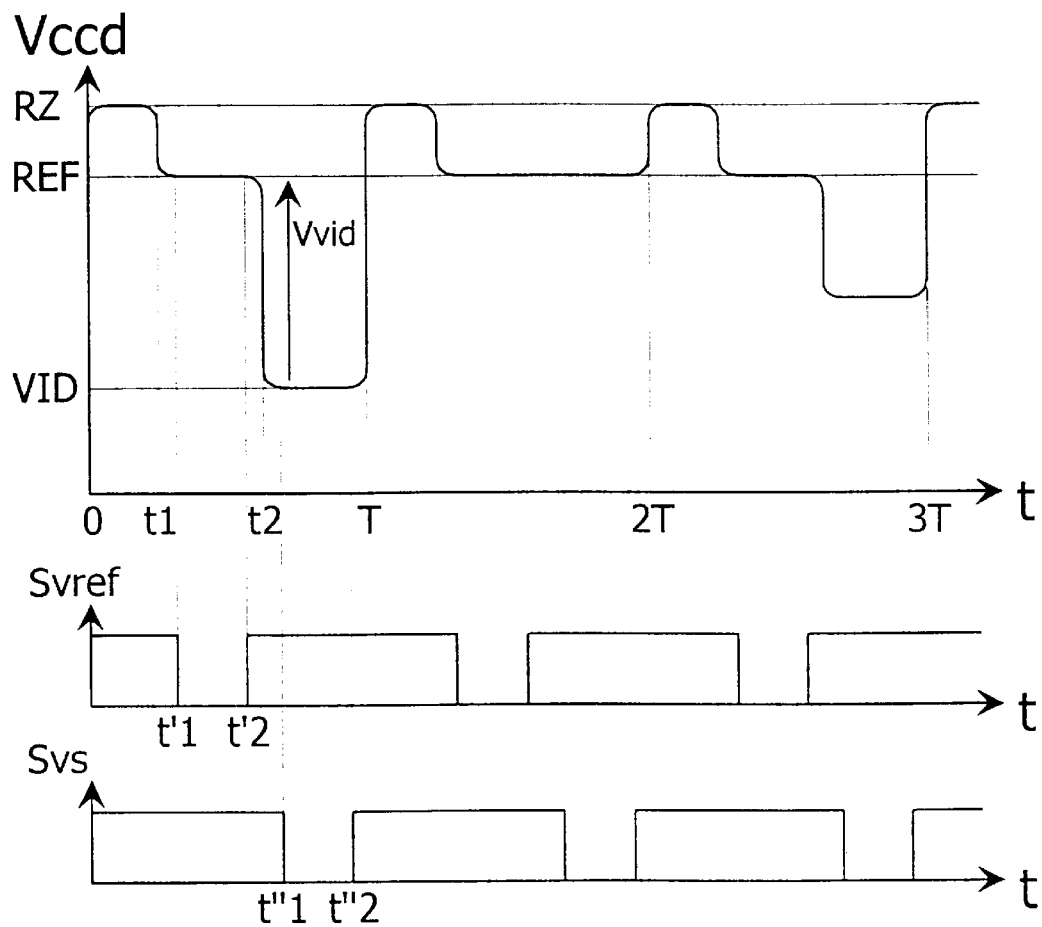
FIG. 4 is a set of chronograms of the development of signals in such a camera.

FIG. 4 shows the development of the signals in such a camera, in order to facilitate comprehension of the invention.

The input signal Vccd of the generating device VGEN is pseudo-periodical with a period T. This signal Vccd successively presents, in the course of each pseudo-period, a zero-reset level RZ, a reference level REF and a video level VID.

At the instant $0$, and in a general manner, at the start of a pseudo-period of the signal Vccd, this signal assumes the zero-reset level RZ. This event is detected by the clock generator CKG which triggers time delays. The signal Vccd remains at the zero-reset level RZ during a predetermined interval $[0; t1]$, and the control signals Svref and Svs are active, which means that the first and second memory devices in the generating device VGEN are in the sustain phase. The video signal Vvid supplied by the generating device VGEN is thus that of the preceding pseudo-period. At the instant t1, the signal Vccd assumes the reference level REF. At a predetermined instant t'1, shortly after the instant t1, a first time delay expires and the control signal Svref becomes inactive. The first memory device then enters the follower phase, the second memory device then still being in the sustain phase. At a predetermined instant t'2, just preceding an instant t2 when the signal Vccd assumes the video level VID, a second time delay expires and the control signal Svref becomes inactive again, and the first memory device again enters the sustain phase, its output signal thus representing the new reference level REF. At a predetermined instant t'1, shortly after the instant t2, a third time delay expires and the control signal Svs becomes inactive. The second memory device then enters the follower phase, while the second memory device remains in the sustain phase. At a predetermined instant t"2, just preceding the instant T when the signal Vccd enters the next pseudo-period and reassumes the zero-reset level RZ, a fourth time delay expires and the control signal Svs becomes inactive again, and the second memory device again enters the sustain phase, its output signal thus representing the new video level VID. The subtracter SUB which is advantageously inhibited during the interval $[t'1; t"2]$ then supplies a new video signal Vvid which is representative of the difference between the reference and video levels REF and VID during the period $[0; T]$.

What is claimed is:

1. A memory device having input and output terminals intended to receive and supply input and output signals, respectively, said device including a capacitive element, a terminal of which constitutes the output terminal of the device and is connected to the input terminal via a switch, characterized in that the switch comprises a first and a second bipolar transistor whose main current paths are arranged head to end between the input and output terminals, the switch also being provided with control means for alternately extracting or injecting the current from or into the bases of the first and second transistors.

2. A memory device as claimed in claim 1, characterized in that the control means include a first and a second controllable current source arranged between the bases of the first and second transistors and first and second power supply terminals, respectively, the bases of the first and second transistors being short-circuited.

3. A memory device as claimed in claim 2, characterized in that it comprises means for preventing simultaneous conduction of the first and second current sources.

4. A memory device as claimed in claim 2, characterized in that it comprises a voltage-regulating element arranged between the output terminal and the bases of the first and second transistors, enabling the amplitude of the base-emitter voltages of the first and second transistors to be limited.

5. A memory device as claimed in claim 1, characterized in that the first and second transistors are of the NPN type with the collector in a ring configuration.

6. A device for generating a video signal, provided with an input intended to receive a pseudo-periodical input signal successively presenting, in the course of each pseudo-period, a reference level and a video level, and an output intended to supply an output signal which is representative of a difference between said levels, said device comprising:

a first and a second memory device intended to memorize the reference and video levels, respectively, in each pseudo-period, and a subtracter intended to implement a difference between said levels, said device being, characterized in that the first and second memory devices are devices as defined in claim 1.

7. An image acquisition device, comprising:

a device for detecting and converting light into a pseudo-periodical electronic signal, an input stage intended to receive said electronic signal and to supply a video signal, and a signal processing unit intended to exploit said video signal, said acquisition device being, characterized in that the input stage includes a generating device as defined in claim 6.

* * * * *